United States Patent
Nielsen et al.

(10) Patent No.: US 11,817,904 B2
(45) Date of Patent: Nov. 14, 2023

(54) OPTICAL TRANSCEIVER WITH REDUCED LANE UTILIZATION

(71) Applicant: Mellanox Technologies, Ltd., Yokneam (IL)

(72) Inventors: Mads Loenstrup Nielsen, Virum (DK); Rony Setter, Kfar Glikson (IL); Eyal Waldman, Tel Aviv (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 22 days.

(21) Appl. No.: 17/212,677

(22) Filed: Mar. 25, 2021

(65) Prior Publication Data
US 2022/0311517 A1    Sep. 29, 2022

(51) Int. Cl.
| | | |
|---|---|---|
| H04B 10/40 | (2013.01) | |
| H05K 1/18 | (2006.01) | |
| G02B 6/28 | (2006.01) | |
| H04B 10/25 | (2013.01) | |
| H05K 1/02 | (2006.01) | |

(52) U.S. Cl.
CPC ............... *H04B 10/40* (2013.01); *G02B 6/28* (2013.01); *H04B 10/25* (2013.01); *H05K 1/0203* (2013.01); *H05K 1/181* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 2007/0092258 A1* | 4/2007 | Nelson | ............... | H04B 10/40 398/135 |
| 2012/0189323 A1* | 7/2012 | Xu | ............... | H04B 10/506 398/201 |
| 2017/0063449 A1* | 3/2017 | Dreps | ............... | H04B 10/038 |
| 2020/0285006 A1* | 9/2020 | Matsui | ............... | H04B 10/40 |

OTHER PUBLICATIONS

Tarluz.com, "Three different potential duplex optical connectors recommended by QSFP-DD MSA", Mar. 19, 2020, Wayback Machine captured May 28, 2020, https://web.archive.org/web/20200528201507/ http://www.tarluz.com/400g-network/three-different-potential-duplex-optical-connectors-recommended-by-qsfp-dd-msa/ (Year: 2020).*
Chinese Office Action from corresponding Chinese Application No. 202210271292.7, dated Sep. 22, 2023, 14 pages, with English translation.

* cited by examiner

*Primary Examiner* — David W Lambert
(74) *Attorney, Agent, or Firm* — Moore & Van Allen PLLC; Michael Madison McCraw

(57) ABSTRACT

Embodiments are disclosed for reduced lane utilization for an optical transceiver. An example optical transceiver apparatus includes at least one optical source and an optical connector. The at least one optical source is attached to a printed circuit board (PCB) and is configured to facilitate communication of optical signals. The PCB comprises an electrical connector electrically connected to the at least one optical source and is configured to facilitate communication of electrical signals. Furthermore, the PCB is attached to a mechanical structure. The optical connector is attached to the mechanical structure and is coupled to the at least one optical source via at least one optical fiber that facilitates transmission of the optical signals.

20 Claims, 8 Drawing Sheets

OPTICAL TRANSCEIVER WITH REDUCED LANE UTILIZATION

TECHNOLOGICAL FIELD

Embodiments of the present invention relate generally to optical transceivers.

BACKGROUND

Traditional mechanical adapters for an optical transceiver module often reduce performance of the optical transceiver module. For instance, traditional mechanical adapters for an optical transceiver module can result in reduced signal integrity, increased electromagnetic interference, and/or limited heat dissipation as compared to implementation of the optical transceiver module without the mechanical adapter. As such, improved optical interconnects for an optical transceiver are desirable.

BRIEF SUMMARY

Example embodiments of the present invention relate generally to system(s), method and apparatus to facilitate an optical transceiver with reduced lane utilization. The details of some embodiments of the subject matter described in this specification are set forth in the accompanying drawings and the description below. Other features, aspects, and advantages of the subject matter will become apparent from the description, the drawings, and the claims.

In an embodiment, an optical transceiver apparatus comprises at least one optical source and an optical connector. The at least one optical source is attached to a printed circuit board (PCB). Furthermore, the at least one optical source is configured to facilitate communication of optical signals. In an embodiment, the PCB comprises an electrical connector electrically connected to the at least one optical source. The electrical connector is configured to facilitate communication of electrical signals. Additionally, the PCB is attached to a mechanical structure. The optical connector is attached to the mechanical structure. Furthermore, the optical connector is coupled to the at least one optical source via at least one optical fiber that facilitates transmission of the optical signals.

In some embodiments, the optical connector is an LC connector coupled to the at least one optical source via the at least one optical fiber.

In some embodiments, the optical connector is an CS connector coupled to the at least one optical source via the at least one optical fiber.

In some embodiments, the optical connector is an SN connector coupled to the at least one optical source via the at least one optical fiber.

In some embodiments, the optical connector is a mini-duplex connector (MDC) coupled to the at least one optical source via the at least one optical fiber.

In some embodiments, the optical connector is an MXC connector coupled to the at least one optical source via the at least one optical fiber.

In some embodiments, the at least one optical source is a vertical cavity surface emitting laser (VCSEL), an externally modulated laser (EML), an electro-absorption modulator, or a directly modulated laser (DML).

In some embodiments, the electrical connector is an electrical edge connector of the PCB.

In some embodiments, the optical transceiver apparatus further comprises an integrated circuit attached to the PCB and configured to drive the at least one optical source. In an embodiment, a first distance between the integrated circuit and the electrical connector is less than a second distance between the integrated circuit and the at least one optical source.

In some embodiments, the mechanical apparatus comprises a heatsink portion. In an embodiment, the at least one optical source is attached to the PCB at a location proximate the heatsink portion of the mechanical apparatus.

In some embodiments, the optical connector supports a plurality of N optical lanes. In an embodiment, the at least one optical fiber supports a plurality of K optical lanes, N is a first integer and K is a second integer, and K is less than N.

In some embodiments, the optical connector is a first optical connector. In some embodiments, the first optical connector is coupled to the at least one optical source via a first optical fiber that facilitates transmission of the optical signals. In some embodiments, a second optical connector is attached to the mechanical structure and is coupled to the at least one optical source via a second optical fiber that facilitates transmission of the optical signals.

In some embodiments, the optical transceiver apparatus is a quad small form-factor pluggable (QSFP) apparatus.

In another embodiment, an optical transceiver system comprises a network interface module, at least one optical source, and an optical connector. The at least one optical source is attached to a printed circuit board (PCB) and is configured to facilitate communication of optical signals. In an embodiment, the PCB comprises an electrical connector electrically connected to the at least one optical source and configured to facilitate communication of electrical signals. Furthermore, the PCB is attached to the network interface module. The optical connector is attached to the network interface module. Furthermore, the optical connector is coupled to the at least one optical source via at least one optical fiber that facilitates transmission of the optical signals.

In some embodiments, the at least one optical source is a vertical cavity surface emitting laser (VCSEL), an externally modulated laser (EML), an electro-absorption modulator, or a directly modulated laser (DML).

In some embodiments, the optical transceiver system further comprises an integrated circuit attached to the PCB and configured to drive the at least one optical source. In an embodiment, a first distance between the integrated circuit and the electrical connector is less than a second distance between the integrated circuit and the at least one optical source.

In some embodiments, the network interface module comprises a heatsink portion. In some embodiments, the at least one optical source is attached to the PCB at a location proximate the heatsink portion of the network interface module.

In some embodiments, the optical connector supports a plurality of N optical lanes, the at least one optical fiber supports a plurality of K optical lanes, N is a first integer and K is a second integer, and K is less than N.

In some embodiments, the optical connector is a first optical connector. In some embodiments, the first optical connector is coupled to the at least one optical source via a first optical fiber that facilitates transmission of the optical signals. In some embodiments, a second optical connector is attached to the network interface module and is coupled to the at least one optical source via a second optical fiber that facilitates transmission of the optical signals.

In some embodiments, the network interface module is a quad small form-factor pluggable (QSFP) network interface module.

In yet another embodiment, a method is provided. The method provides for receiving an electrical signal via an electrical connector associated with a printed circuit board (PCB). The PCB is attached to a mechanical structure of a network interface module. The method also provides for controlling, based on the electrical signal, emission of an optical signal via at least one optical source attached to the PCB. The method also provides for facilitating communication of the optical signal via an optical connector attached to the mechanical structure of the network interface module. In an embodiment, the optical connector is coupled to the at least one optical source via at least one optical fiber.

The above summary is provided merely for purposes of summarizing some example embodiments to provide a basic understanding of some aspects of the present invention. Accordingly, it will be appreciated that the above-described embodiments are merely examples and should not be construed to narrow the scope or spirit of the present invention in any way. It will be appreciated that the scope of the present invention encompasses many potential embodiments in addition to those here summarized, some of which will be further described below.

BRIEF DESCRIPTION OF THE DRAWINGS

Figure 1:
Figure 2:
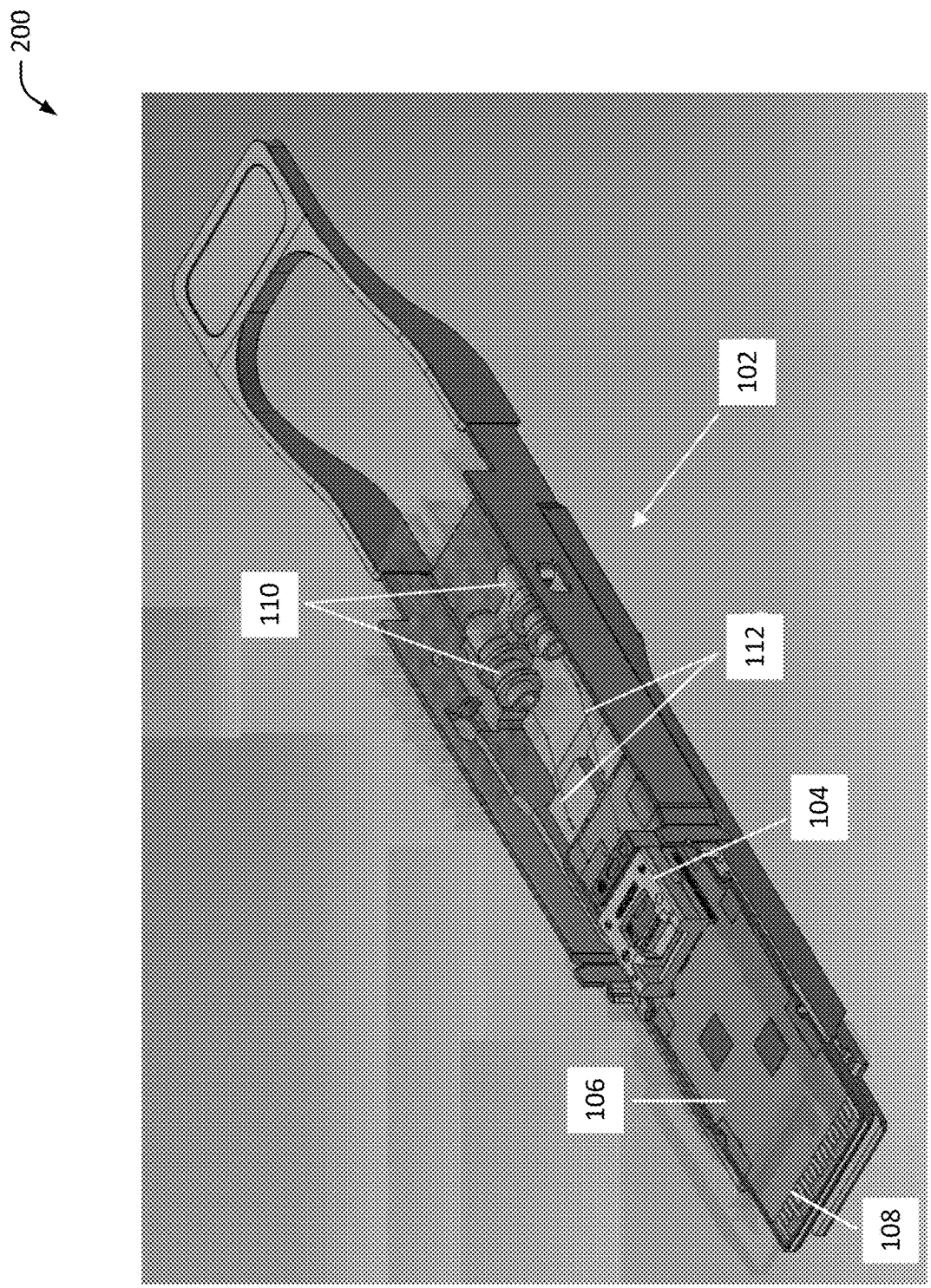
Figure 3:
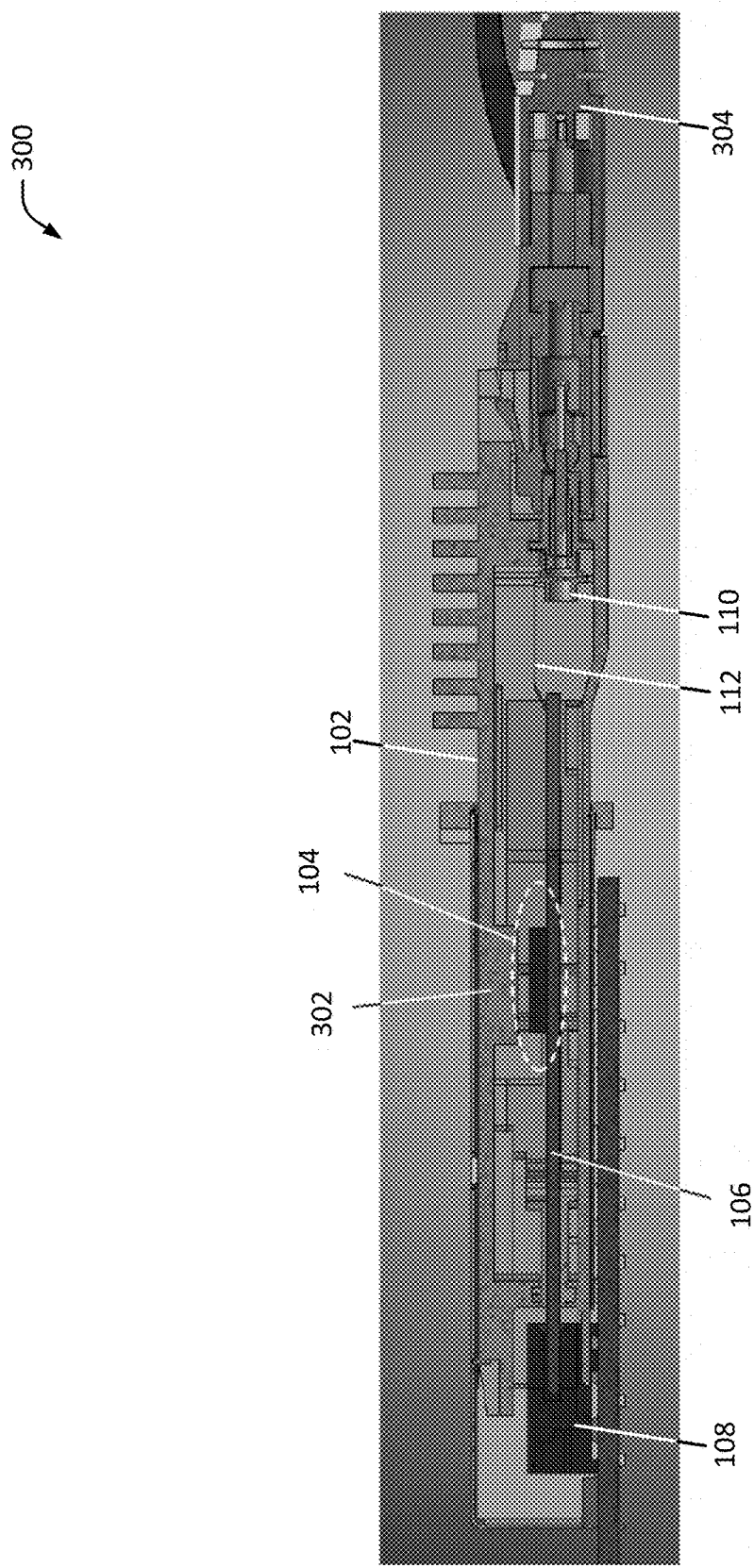
Figure 4:
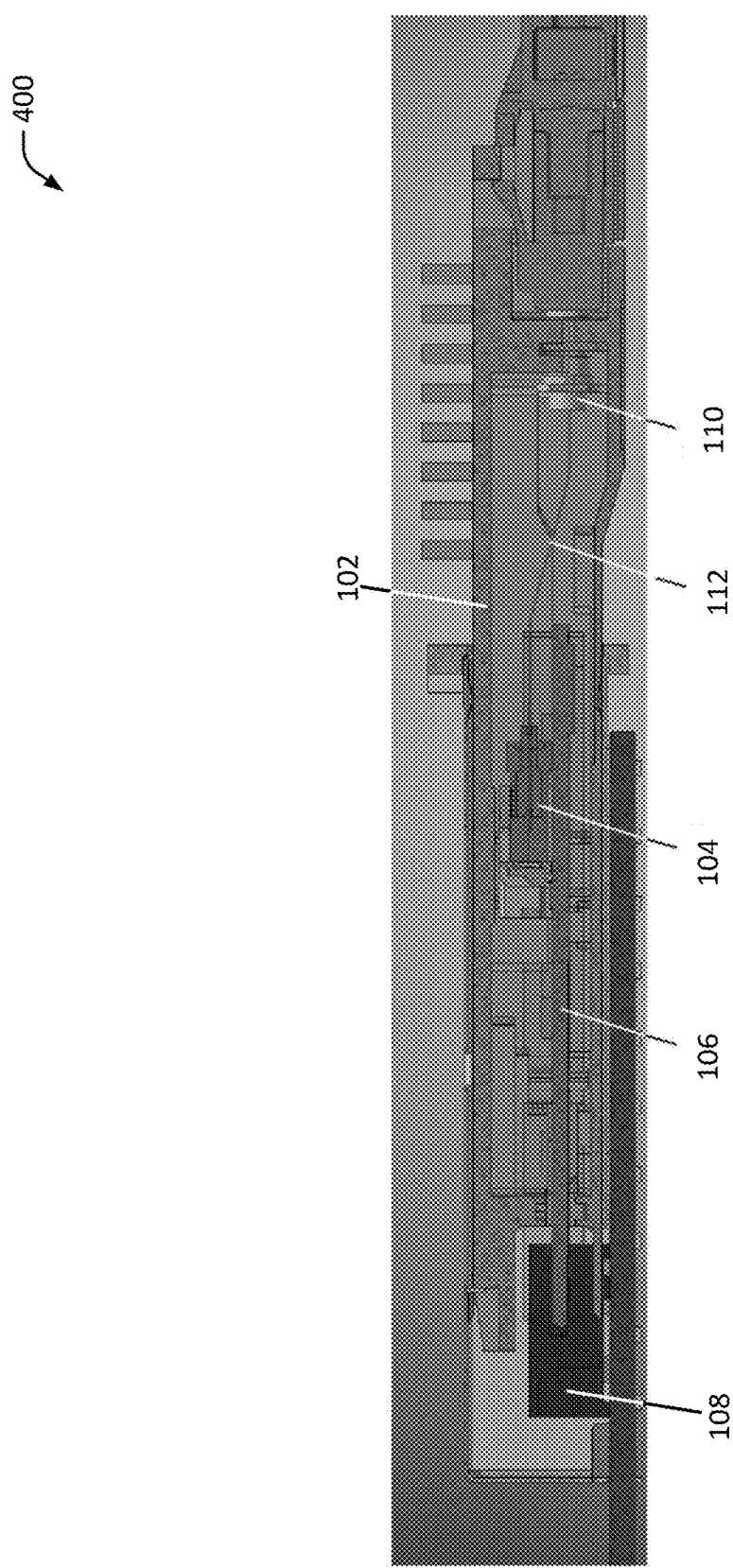
Figure 5:
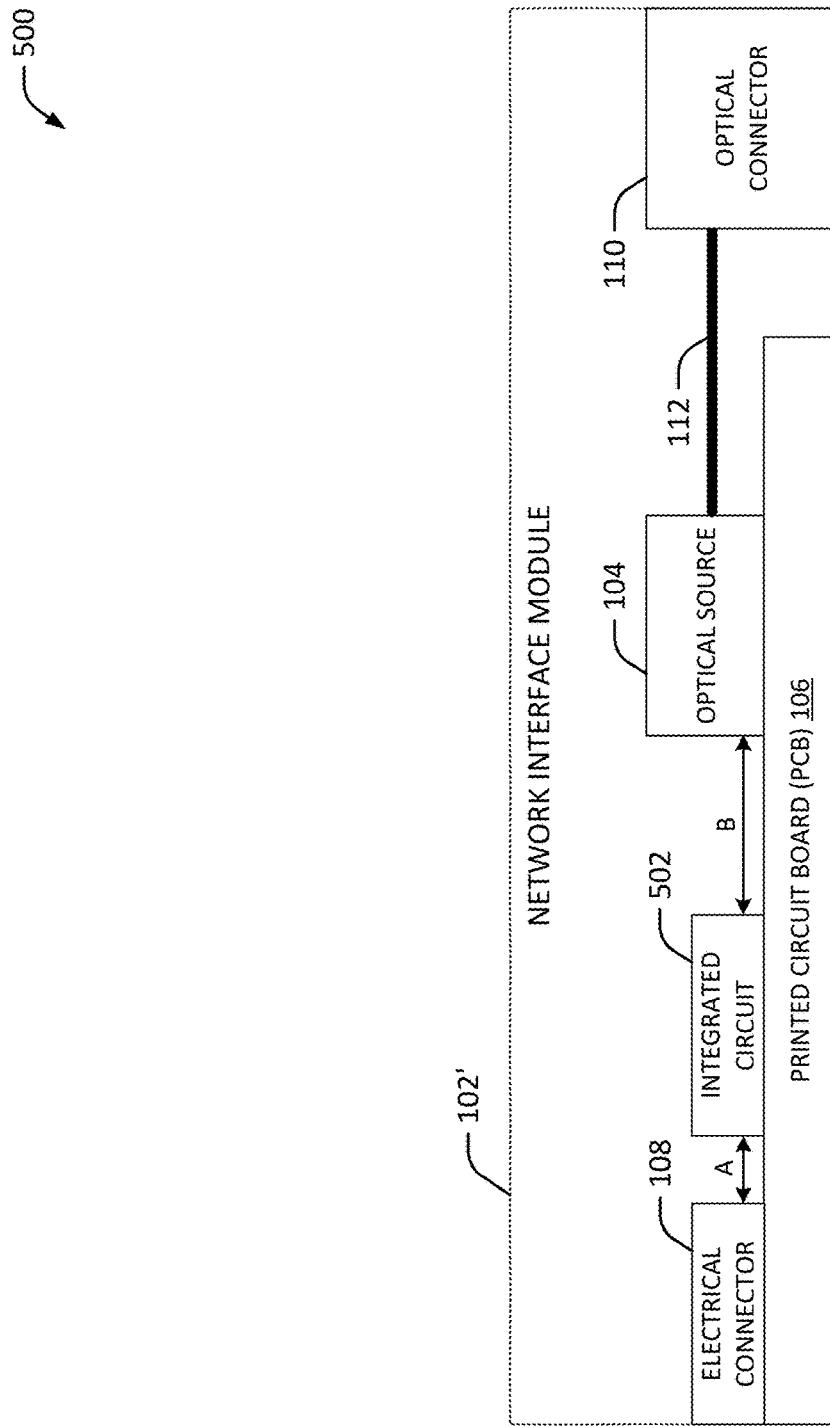
Figure 6:
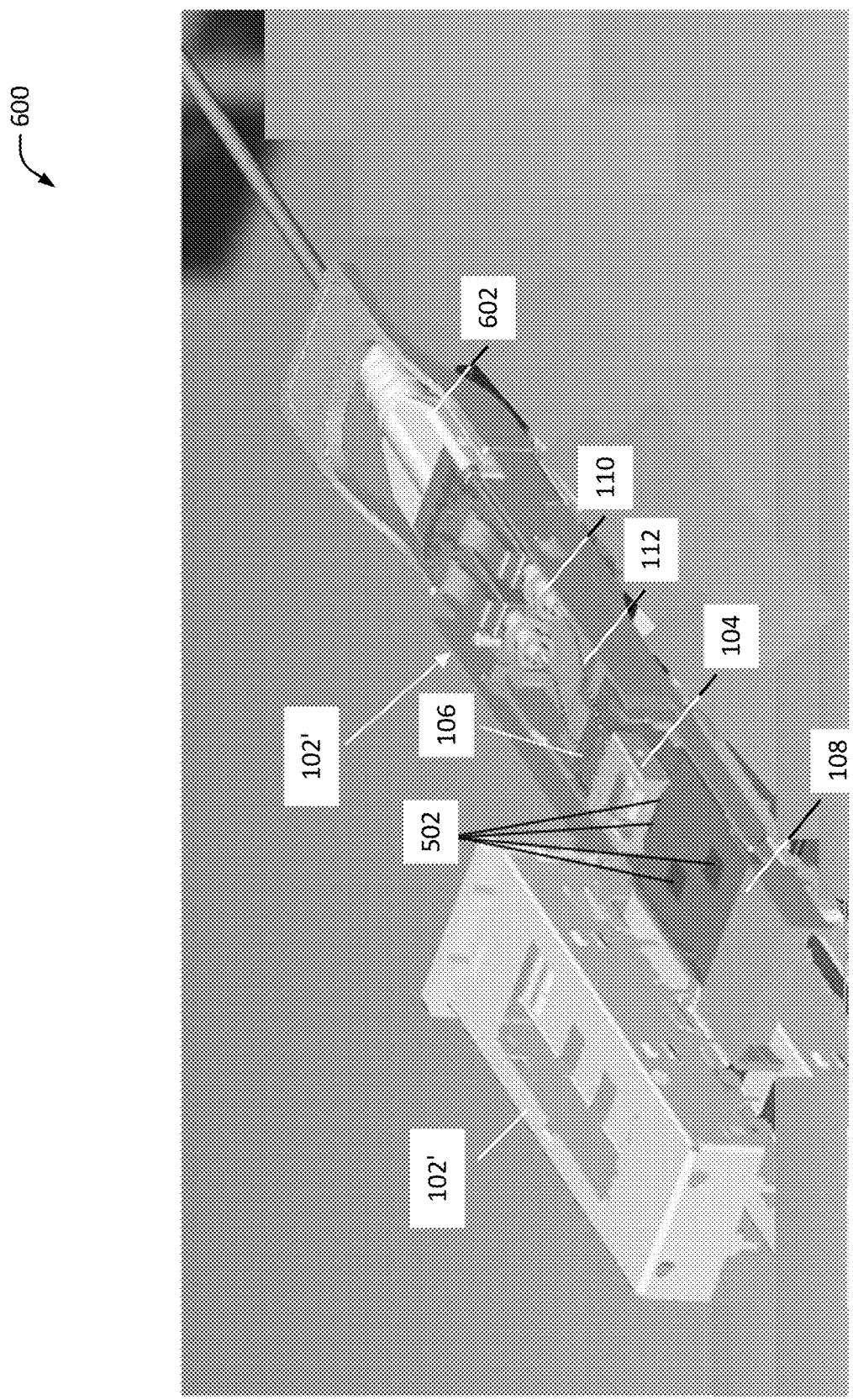
Figure 7:
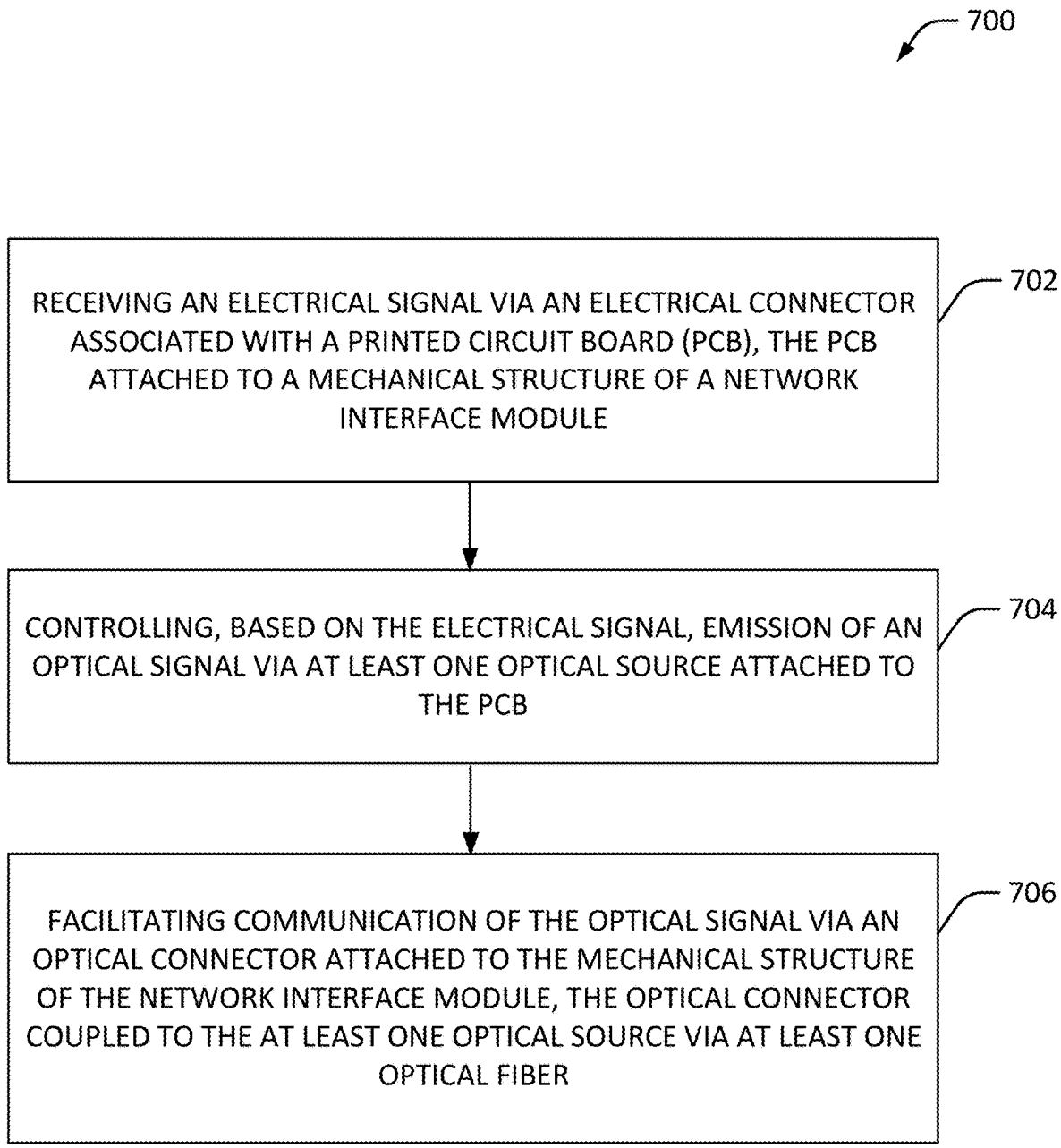
Figure 8:
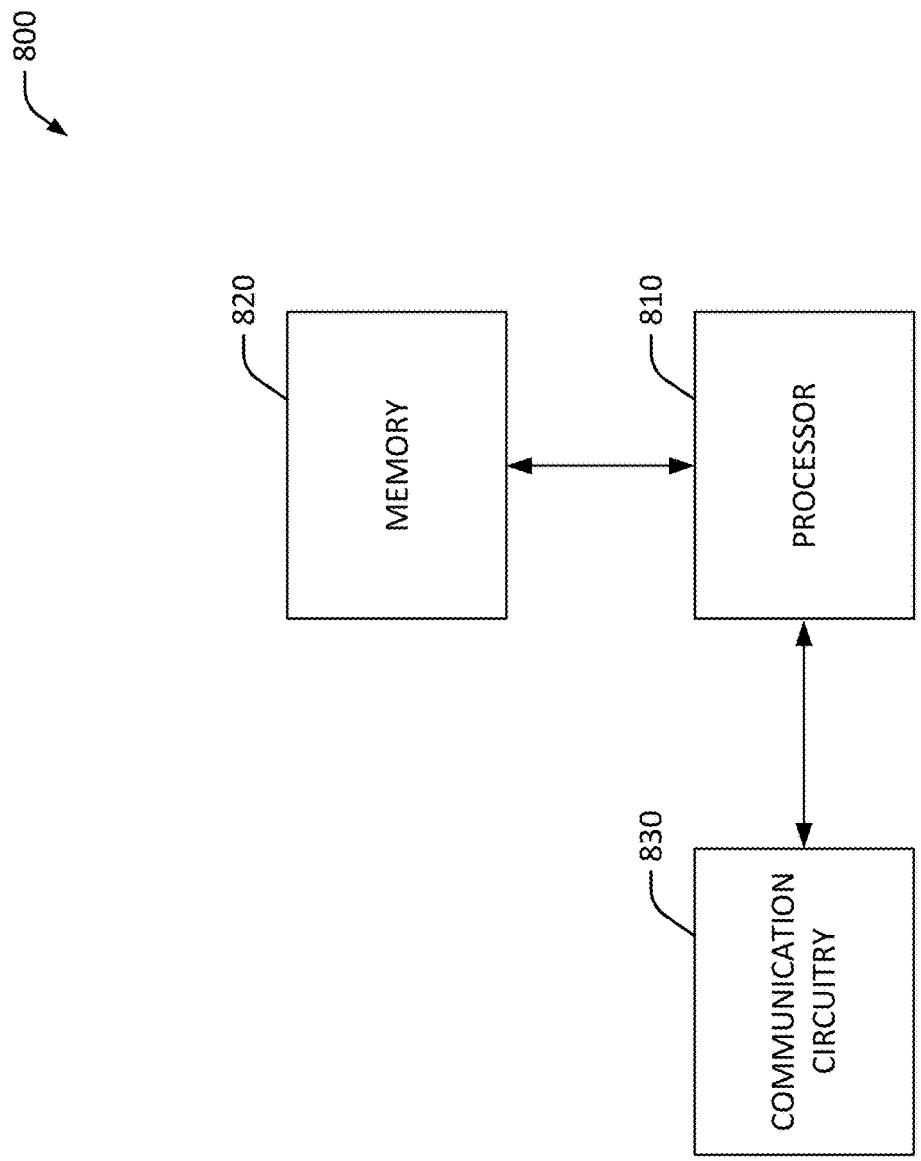

Having thus described the disclosure in general terms, reference will now be made to the accompanying drawings, which are not necessarily drawn to scale, and wherein:

FIG. 1 illustrates an exemplary system associated with an optical transceiver with reduced lane utilization, in accordance with one or more embodiments of the present disclosure;

FIG. 2 illustrates another exemplary system associated with an optical transceiver with reduced lane utilization, in accordance with one or more embodiments of the present disclosure;

FIG. 3 illustrates yet another exemplary system associated with an optical transceiver with reduced lane utilization, in accordance with one or more embodiments of the present disclosure;

FIG. 4 illustrates yet another exemplary system associated with an optical transceiver with reduced lane utilization, in accordance with one or more embodiments of the present disclosure;

FIG. 5 illustrates yet another exemplary system associated with an optical transceiver with reduced lane utilization, in accordance with one or more embodiments of the present disclosure;

FIG. 6 illustrates yet another exemplary system associated with an optical transceiver with reduced lane utilization, in accordance with one or more embodiments of the present disclosure;

FIG. 7 is a flowchart illustrating an example method for facilitating reduced lane utilization for an optical transceiver, in accordance with one or more embodiments of the present disclosure; and FIG. 8 illustrates an example computing system that may be embedded in the communication system, in accordance with one or more embodiments of the present disclosure.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. Thus, use of any such terms should not be taken to limit the spirit and scope of embodiments of the present invention.

A QSFP-to-SFP Adapter (QSA) is a mechanical adapter that can be inserted inside a QSFP port and can enable plugging in a smaller, single-channel small form-factor pluggable (SFP) device into a QSFP 4-channel port such that different port types and/or devices with different speeds are connected to each other. In certain embodiments, a QSA can be employed in an optical transceiver (e.g., an optical transceiver with a 4-channel QSFP port on a switch or network adapter). In certain embodiments, a QSA can facilitate a connection between different ports (e.g., between 100G and 25G ports, between 40G and 10G ports, etc.). Current networking solutions can employ a combination of a QSA and an SFP port (e.g., a slot on a network device into which SFP transceivers are inserted). However, in applications where a QSA is employed, signal integrity and/or electromagnetic interference (EMI) performance can suffer as compared to employing a network device without an adapter. One of the reasons for such performance degradation can be additional electrical connections inside the adapter that result in degraded impedance matching and/or energy loss. In addition, because a QSA is a mechanical interface, mechanical tolerances can cause additional energy loss in the form of radiation and/or increased EMI. For multi-level signaling at increasingly high symbol rates, the mechanical tolerances of additional high-speed electrical interface(s) in the QSA to, for example, satisfy impedance matching specification(s) can be difficult to achieve. Also, employing a QSA generally requires usage of two separate Printed Circuit Board (PCB) portions within the module, with metal spring contacts between the two portions of the PCB. This arrangement can lead to further deterioration of signal integrity. Employing a QSA also generally results in inefficient thermal dissipation. In applications with limited available cooling capability, such as a transceiver in a network interface controller, the temperature of certain components (e.g., the optical transmitter in the transceiver) may exceed a maximum temperature rating. Such high temperatures may compromise the reliability of the transceiver and/or components (e.g., laser diodes) of the transceiver. Moreover, employment of a QSA generally increases the cost of the transceiver. As such, improved optical interconnects for an optical transceiver are desirable.

Thus, to address these and/or other issues, an optical transceiver with reduced lane utilization is disclosed herein. For example, in one or more embodiments, an optical transceiver with optimal (e.g., reduced) lane width utilization is provided. In one or more embodiments, the optical transceiver with reduced lane utilization can be provided without a QSA. For instance, in one or more embodiments, the optical transceiver disclosed herein can provide an adapter-free optical transceiver with reduced lane utilization (e.g., using depopulation of lanes). In one or more embodiments, the optical transceiver with reduced lane utilization is a K-lane transceiver in an N>K lane module footprint, where N is a first integer and K is a second integer. The optical transceiver disclosed herein also supports NDR 200/400 optical communication specification by implementing respective optical transceivers in a QSFP footprint. As such, in one or more embodiments, improved performance and/or improved efficiency of an optical transceiver is provided. For example, in one or more embodiments, an optical transceiver with improved signal integrity, decreased EMI, and/or improved heat dissipation is provided. Additionally, a low-cost optical transceiver device can be provided for improved optical communications. In an embodiment, the optical transceiver with reduced lane utilization can be employed for an intra-datacenter connection. In another embodiment, the optical transceiver with reduced lane utilization can be employed for high performance computing connection. However, it is to be appreciated that, in certain embodiments, the optical transceiver with reduced lane utilization can be employed in another type of networking environment and/or another type of communications network.

FIG. 1 illustrates a system 100 that facilitates reduced lane utilization for an optical transceiver according to one or more embodiments of the present disclosure. In one or more embodiments, the system 100 is an optical transceiver device (e.g., an optical transceiver module). The system 100 includes a network interface module 102. In an embodiment, the network interface module 102 is a quad small form-factor pluggable (QSFP) network interface module. In one or more embodiments, the network interface module 102 can be, for example, a transceiver device (e.g., an optical transceiver) that facilitates fiber optic communication. In one or more embodiments, the network interface module 102 can be a pluggable optical transceiver to facilitate connection with an optical communication channel. The optical communication channel can be, for example, a fiber optic communication channel (e.g., a transparent fiber optic connection, a fiber optic wire, etc.) that transmits pulses of infrared light. In an embodiment, the optical communication channel includes a single optical communication channel (e.g., a single fiber optic wire). In another embodiment, the optical communication channel includes two or more optical communication channels (e.g., two or more fiber optic wires). For example, in an embodiment, the optical communication channel can include one or more fiber optic wires for transmission of an optical signal, and one or more fiber optic wires for reception of an optical signal. In another embodiment, the optical communication channel can include a fiber optic wire where respective signals for optical channels are multiplexed and transmitted via the fiber optic wire. In another embodiment, the optical communication channel can include additionally or alternatively include a fiber bundle. However, it is to be appreciated that, in certain embodiments, the optical communication channel can be implemented in a different manner to facilitate communication of optical signals.

In an embodiment, the network interface module 102 includes at least an optical source 104, a printed circuit board (PCB) 106, an electrical connector 108, and an optical connector 110. The optical source 104 can include one or more optical sources. For instance, in one or more embodiments, the optical source 104 can include at least one vertical cavity surface emitting laser (VCSEL), at least one externally modulated laser (EML), and/or at least one electro-absorption modulator, or a directly modulated laser (DML). The optical source 104 can be attached to the PCB 106. For example, in one or more embodiments, the optical source 104 can be physically attached and/or communicatively coupled (e.g., electrically coupled) to the PCB 106. The PCB 106 can also comprise the electrical connector 108.

For instance, in an embodiment, the electrical connector 108 can be an electrical edge connector of the PCB 106. In another embodiment, the electrical connector 108 can be attached to the PCB 106. In one or more embodiments, the electrical connector 108 can be electrically coupled to the optical source 104. Additionally, in one or more embodiments, the electrical connector 108 can be configured to be plugged into an electrical socket of a device (e.g., an electrical port of a server switch). In one or more embodiments, the PCB 106 can be attached to the network interface module 102. For example, in one or more embodiments, the PCB 106 can be attached to a mechanical structure of the network interface module 102.

In one or more embodiments, the optical source 104 can be configured to facilitate communication of optical signals. In an embodiment, the optical source 104 can be configured to emit an optical signal. The optical signal can be, for example, an optical signal associated with data for transmission via one or more optical communication channels 112. For example, in one or more embodiments, the optical signal can be an electromagnetic signal that transmits data at 10G, 25G, 40G, 50G, 100G, 200G, 400G or another data speed via the one or more optical communication channels 112. In one or more embodiments, the optical source 104 can emit the optical signal at a particular wavelength (e.g., 850 nm or another wavelength).

In certain embodiments, the optical source 104 is a semiconductor laser diode that emits the optical signal vertically with respect to a top surface of the optical source 104. For example, in one or more embodiments, the optical source 104 can include a set of mirrors (e.g., a set of distributed Bragg reflector mirrors) parallel to a wafer surface, one or more oxide layers, a gain region, and/or a laser cavity (e.g., an active region) to facilitate generation of a laser light for the optical signal. In one or more embodiments, the set of mirrors (e.g., the set of distributed Bragg reflector mirrors) of the optical source 104 can include a set of layers with alternating high refractive indices and low refractive indices to facilitate generation of a laser light for the optical signal. In a non-limiting example, the optical source 104 can be associated with 4× fiber channel data links. In certain embodiments, an optical path of the optical signal can include a mirror to facilitate transmission of the optical signal via the one or more optical communication channels 112. For example, in one or more embodiments, the mirror can be an optical path component (e.g., a reflective surface) that redirects and/or guides the optical signal to the one or more optical communication channels 112.

The one or more optical communication channels 112 can be coupled to the optical connector 110. Furthermore, the optical connector 110 can be coupled (e.g., directly coupled) to the optical source 104 via the one or more optical communication channels 112. In one or more embodiments, the one or more optical communication channels 112 can be one or more optical fibers (e.g., one or more transparent fiber optic connections, one or more fiber optic wires, etc.) that transmit pulses of infrared light. In an embodiment, the one or more optical communication channels 112 can include a first fiber optic wire for transmission of optical signals and a second fiber optic wire for reception of optical signals. In one or more embodiments, the optical connector 110 can be attached to the network interface module 102. For example, in one or more embodiments, the optical connector 110 can be attached to a mechanical structure of the network interface module 102. In certain embodiments, the optical connector 110 includes a first optical connector coupled to the optical source 104 via a first optical fiber of the one or more optical communication channels 112, and the optical connector 110 further includes a second optical connector coupled to the optical source 104 via a second optical fiber of the one or more optical communication channels 112. The optical connector 110 can be a fiber optic connector that is configured to be removably connected to fiber optic cables (e.g., a pair of fiber optic cables). In an embodiment, the optical connector 110 can be a Lucent connector (LC) connector (e.g., a pair of LC connectors) coupled to the optical source 104 via the one or more optical communication channels 112. Additionally, in this embodiment, the optical connector 110 can be configured to be removably connected to an LC connector fiber optic cable (e.g., a pair of LC connector fiber optic cables). In another embodiment, the optical connector 110 can be a CS® connector (e.g., a pair of CS® connectors) coupled to the optical source 104 via the one or more optical communication channels 112. Additionally, in this embodiment, the optical connector 110 can be configured to be removably connected to a CS® connector fiber optic cable (e.g., a pair of CS® connector fiber optic cables). In another embodiment, the optical connector 110 can be an SN® connector (e.g., a pair of SN® connectors) coupled to the optical source 104 via the one or more optical communication channels 112. Additionally, in this embodiment, the optical connector 110 can be configured to be removably connected to an SN® connector fiber optic cable (e.g., a pair of SN® connector fiber optic cables). In another embodiment, the optical connector 110 can be a mini-duplex connector (MDC) connector (e.g., a pair of MDC connectors) coupled to the optical source 104 via the one or more optical communication channels 112. Additionally, in this embodiment, the optical connector 110 can be configured to be removably connected to an MDC connector fiber optic cable (e.g., a pair of MDS connector fiber optic cables). In another embodiment, the optical connector 110 can be an MXC® connector (e.g., a pair of MXC® connectors) coupled to the optical source 104 via the one or more optical communication channels 112. Additionally, in this embodiment, the optical connector 110 can be configured to be removably connected to an MXC® connector fiber optic cable (e.g., a pair of MXC® connector fiber optic cables). However, it is to be appreciated that, in certain embodiments, the optical connector 110 can be a different type of optical connector. In one or more embodiments, the optical connector 110 can support a plurality of N optical lanes and the one or more optical communication channels 112 (e.g., the one or more optical fibers) may support a plurality of K optical lanes, wherein N is a first integer, K is a second integer, and K is less than N.

FIG. 2 illustrates a system 200 that facilitates reduced lane utilization for an optical transceiver according to one or more embodiments of the present disclosure. The system 200 illustrates an exemplary perspective view associated with the system 100. The system 200 includes the network interface module 102. The network interface module 102 can include at least the optical source 104, the PCB 106, the electrical connector 108, and the optical connector 110. Furthermore, in one or more embodiments, the optical connector 110 is coupled to the optical source 104 via the one or more optical communication channels 112. In an embodiment, FIG. 2 illustrates the network interface module (e.g., the optical transceiver module) with reduced lane utilization (e.g., K=1). In one or more embodiments, the network interface module 102 (e.g., the optical transceiver module) is implemented without a QSFP-to-SFP Adapter (QSA). In an embodiment, the optical source 104 transmits optical signals to a single active optical lane via the one or more optical communication channels 112. In the embodiment illustrated in FIG. 2, the one or more optical communication channels 112 comprise two optical fibers (e.g., a first optical fiber for transmission Tx and a second optical fiber for reception Rx). Furthermore, the one or more optical communication channels 112 can be terminated by the optical connector 110. In the embodiment illustrated in FIG. 2, the first optical fiber for transmission Tx is terminated by a first optical connector and the second optical fiber for reception Rx is terminated by a second optical connector.

FIG. 3 illustrates a system 300 that facilitates reduced lane utilization for an optical transceiver according to one or more embodiments of the present disclosure. The system 300 illustrates an exemplary cross-sectional view associated with the system 100. The system 300 includes the network interface module 102. The network interface module 102 can include at least the optical source 104, the PCB 106, the electrical connector 108, and the optical connector 110. Furthermore, in one or more embodiments, the optical connector 110 is coupled to the optical source 104 via the one or more optical communication channels 112. In one or more embodiments, the network interface module 102 (e.g., the optical transceiver module) is implemented without a QSA. In an embodiment, the PCB 106 is a single, continuous PCB that facilitates an electrical connection between the electrical connector 108 and the optical source 104. In one or more embodiments, the mechanical structure of the network interface module 102 is associated with a heatsink portion 302. Furthermore, in one or more embodiments, the optical source 104 can be attached to the PCB 106 at a location proximate the heatsink portion 302. The heatsink portion 302 can be, for example, an area of the network interface module 102 with optimal heatsinking. A conventional network interface module with a QSA generally shifts components that dissipate heat away from an optimal heatsinking location. For example, it is generally difficult to implement components that dissipate heat at an optical heatsinking location for conventional network interface module with a QSA. Furthermore, conventional network interface modules generally include a heatsink at a position with respect to a mechanical structure as defined by a standard. As such, heat dissipation associated with the optical source 104 is improved as compared to conventional network interface modules. Additionally, in an embodiment, the optical connector 110 can be configured to be removably connected to a fiber optic cable 304 (e.g., a pair of fiber optic cables). The fiber optic cable 304 can be, for example, an LC connector fiber optic cable (e.g., a pair of LC connector fiber optic cables), a CS® connector (e.g., a pair of CS® connectors), an SN® connector (e.g., a pair of SN® connectors), an MDC connector (e.g., a pair of MDC connectors), an MXC® connector (e.g., a pair of MXC® connectors), or another type of fiber optic cable.

FIG. 4 illustrates a system 400 that facilitates reduced lane utilization for an optical transceiver according to one or more embodiments of the present disclosure. The system 400 illustrates another exemplary cross-sectional view associated with the system 100. The system 400 includes the network interface module 102. The network interface module 102 can include at least the optical source 104, the PCB 106, the electrical connector 108, and the optical connector 110. Furthermore, in one or more embodiments, the optical connector 110 is coupled to the optical source 104 via the one or more optical communication channels 112. In one or more embodiments, the network interface module 102 (e.g., the optical transceiver module) is implemented without a QSA. In an embodiment, the one or more optical communication channels 112 are configured as a connecting element (e.g., one or more optical fibers) between the optical source 104 and the optical connector. As illustrated in FIG. 4, the PCB 106 and/or the optical connector 110 can be attached to a mechanical structure of the network interface module 102.

FIG. 5 illustrates a system 500 that facilitates reduced lane utilization for an optical transceiver according to one or more embodiments of the present disclosure. The system 500 includes a network interface module 102'. The network interface module 102' can be, for example, an alternate embodiment of the network interface module 102. The network interface module 102 can include at least the optical source 104, the PCB 106, the electrical connector 108, the optical connector 110, and an integrated circuit 502. Furthermore, in one or more embodiments, the optical connector 110 is coupled to the optical source 104 via the one or more optical communication channels 112. In one or more embodiments, the network interface module 102' (e.g., the optical transceiver module) is implemented without a QSA. In one or more embodiments, the network interface module 102' includes a heatsink portion (e.g., the heatsink portion 302). In one or more embodiments, the integrated circuit 502 can be attached to the PCB 106. Furthermore, in one or more embodiments, the integrated circuit 502 can be located between the optical source 104 and the electrical connector 108. In one or more embodiments, a first distance A between the integrated circuit 502 and the electrical connector 108 can be less than a second distance B between the integrated circuit 502 and the optical source 104. In one or more embodiments, a location of the integrated circuit 502 with respect to the electrical connector 108 and the optical source 104 can overlap with at least a portion of a location associated with a heatsink portion (e.g., the heatsink portion 302) of the network interface module 102'. As such, heat dissipation associated with the optical source 104 and/or the integrated circuit 502 can be improved.

The integrated circuit 502 can be configured to manage emission of one or more optical signals via the optical source 104. In certain embodiments, the integrated circuit 502 can be a network interface controller (NIC). In one or more embodiments, the integrated circuit 502 can be configured to drive the optical source 104. For example, in one or more embodiments, the integrated circuit 502 can be configured to provide an electrical signal (e.g., an electrical signal associated with the electrical connector 108) to the optical source 104 to control emission of one or more optical signals emitted by the optical source 104. In certain embodiments, the integrated circuit 502 can be configured to manage timing of emission of optical signals via the optical source 104. In one or more embodiments, the integrated circuit 502 can be configured to manage one or more inputs provided to the optical source 104 and/or one or more settings for the optical source 104 to facilitate management of emission of one or more optical signals via the optical source 104. In one or more embodiments, the integrated circuit 502 can be configured to measure an electrical characteristic associated with the optical source 104. Furthermore, in one or more embodiments, the integrated circuit 502 can be configured to manage the transmission of optical signals based on the electrical characteristic measured. In one or more embodiments, the integrated circuit 502 can be configured to perform error correction, sifting and/or privacy amplification with respect to optical signals to facilitate transmission of optical signals.

FIG. 6 illustrates a system 600 that facilitates reduced lane utilization for an optical transceiver according to one or more embodiments of the present disclosure. The system 600 illustrates an exemplary perspective view associated with the system 500. The system 600 includes the network interface module 102'. The network interface module 102' can include at least the optical source 104, the PCB 106, the electrical connector 108, the optical connector 110, and the integrated circuit 502. Furthermore, in one or more embodiments, the optical connector 110 is coupled to the optical source 104 via the one or more optical communication channels 112. FIG. 6 illustrates the network interface module (e.g., the optical transceiver module) with reduced lane utilization (e.g., K=1). In one or more embodiments, the network interface module 102' (e.g., the optical transceiver module) is implemented without a QSA. In an embodiment, the optical source 104 transmits optical signals to a single active optical lane via the one or more optical communication channels 112. In the embodiment illustrated in FIG. 6, the one or more optical communication channels 112 comprise two optical fibers (e.g., a first optical fiber for transmission Tx and a second optical fiber for reception Rx). Furthermore, the one or more optical communication channels 112 can be terminated by the optical connector 110. In the embodiment illustrated in FIG. 6, the first optical fiber for transmission Tx is terminated by a first optical connector and the second optical fiber for reception Rx is terminated by a second optical connector. Additionally, in an embodiment, the optical connector 110 can be configured to be removably connected to a fiber optic cable 602 (e.g., a pair of fiber optic cables). The fiber optic cable 602 can be, for example, an LC connector fiber optic cable (e.g., a pair of LC connector fiber optic cables), a CS® connector (e.g., a pair of CS® connectors), an SN® connector (e.g., a pair of SN® connectors), an MDC connector (e.g., a pair of MDC connectors), an MXC® connector (e.g., a pair of MXC® connectors), or another type of fiber optic cable. In one or more embodiments, the PCB 106 can be a single, continuous PCB 307 to provide, for example, improved signal integrity due to minimized usage of metal contacts and/or additional electrical interfaces. In addition, in one or more embodiments, a location of the integrated circuit 502 (e.g., one or more heat-dissipating components of the integrated circuit 502) can overlap with a location of one or more heatsink portions of the network interface module 102' such that heat dissipation for the network interface module 102' is improved.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices/entities, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

FIG. 7 is a flowchart illustrating an example method 700 for facilitating reduced lane utilization for an optical transceiver in accordance with one or more embodiments of the present disclosure. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 7 may, for example, be performed by an example computing system 800 (shown in FIG. 8) that is embedded in a network interface module (e.g., the network interface module 102 and/the network interface module 102'), an optical source (e.g., the optical source 104), and/or an integrated circuit (e.g., the integrated circuit 502). In some embodiments, the computing system 800 is a firmware computing system embedded in a network interface module (e.g., the network interface module 102 and/the network interface module 102'), an optical source (e.g., the optical source 104), and/or an integrated circuit (e.g., the integrated circuit 502). In one or more embodiments, one or more of the operations illustrated in FIG. 7 may, for example, be performed by a network interface module (e.g., the network interface module 102 and/or the network interface module 102'), an optical source (e.g., the optical source 104), and/or an integrated circuit (e.g., the integrated circuit 502). In one or more embodiments, at operation 702, the computing system 800 receives an electrical signal via an electrical connector associated with a printed circuit board (PCB), where the PCB is attached to a mechanical structure of a network interface module. In one or more embodiments, at operation 704, the computing system 800 controls, based on the electrical signal, emission of an optical signal via at least one optical source attached to the PCB. In one or more embodiments, at operation 706, the computing system 800 facilitates communication of the optical signal via an optical connector attached to the mechanical structure of the network interface module, where the optical connector is coupled to the at least one optical source via at least one optical fiber.

FIG. 8 illustrates the computing system 800 that may be embedded in a datacenter network system. In some cases, the computing system 800 may be a firmware computing system communicatively coupled with, and configured to control, one or more circuit modules associated with a network interface module (e.g., a QSFP network interface module, an optical transceiver module). For example, the computing system 800 may be a firmware computing system and/or a controller computing system communicatively coupled with one or more circuit modules, such as a network interface module (e.g., the network interface module 102 and/or the network interface module 102'), an optical source (e.g., the optical source 104), and/or an integrated circuit (e.g., the integrated circuit 502). The computing system 800 may include or otherwise be in communication with a processor 810, a memory circuitry 820, and communication circuitry 830. In some embodiments, the processor 810 (which may include multiple or co-processors or any other processing circuitry associated with the processor) may be in communication with the memory circuitry 820. The memory circuitry 820 may comprise non-transitory memory circuitry and may include one or more volatile and/or non-volatile memories. In some examples, the memory circuitry 820 may be an electronic storage device (e.g., a computer readable storage medium) configured to store data that may be retrievable by the processor 810. In some examples, the data stored in the memory 820 may include communication protocol data, or the like, for enabling the apparatus to carry out various functions or methods in accordance with embodiments of the present invention, described herein.

In some examples, the processor 810 may be embodied in a number of different ways. For example, the processor may be embodied as one or more of various hardware processing means such as a microprocessor, a coprocessor, a digital signal processor (DSP), a controller, or a processing element with or without an accompanying DSP. The processor 810 may also be embodied in various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multithreading. In some embodiments, the processor 810 is a microprocessor.

In an example embodiment, the processor 810 may be configured to execute instructions, such as computer program code or instructions, stored in the memory circuitry 820 or otherwise accessible to the processor 810. Alternatively or additionally, the processor 810 may be configured to execute hard-coded functionality. As such, whether configured by hardware or software instructions, or by a combination thereof, the processor 810 may represent a computing entity (e.g., physically embodied in circuitry) configured to perform operations according to an embodiment of the present invention described herein. For example, when the processor 810 is embodied as an ASIC, FPGA, or similar, the processor may be configured as hardware for conducting the operations of an embodiment of the invention. Alternatively, when the processor 810 is embodied to execute software or computer program instructions, the instructions may specifically configure the processor 810 to perform the algorithms and/or operations described herein when the instructions are executed. However, in some cases, the processor 810 may be a processor of a device (e.g., a mobile terminal or a fixed computing device) specifically configured to employ an embodiment of the present invention by further configuration of the processor using instructions for performing the algorithms and/or operations described herein. The processor 810 may further include a clock, an arithmetic logic unit (ALU) and logic gates configured to support operation of the processor 810, among other things.

The computing system 800 may optionally also include the communication circuitry 830. The communication circuitry may be any means embodied in either hardware or a combination of hardware and software that is configured to receive and/or transmit data from/to a network and/or any other device or module in communication with the computing system 800. In this regard, the communication interface may include, for example, supporting hardware and/or software for enabling communications. As such, for example, the communication circuitry 830 may include a communication modem and/or other hardware/software for supporting communication via cable, universal serial bus (USB), integrated circuit receiver, or other mechanisms.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. An optical transceiver apparatus comprising:
    at least one optical source attached to a printed circuit board (PCB) and configured to facilitate communication of optical signals,
    wherein the PCB comprises an electrical connector electrically connected to the at least one optical source and configured to facilitate communication of electrical signals, and wherein the PCB is attached to a mechanical structure; and
    an optical connector attached to the mechanical structure and coupled to the at least one optical source via at least one optical fiber that facilitates transmission of the optical signals,
    wherein the optical connector supports a plurality of N optical lanes defined by a second standard, wherein the at least one optical fiber supports a plurality of K optical lanes defined by a first standard that is different from the second standard, wherein N is a first integer and K is a second integer, and wherein K is less than N.

2. The optical transceiver apparatus of claim 1, wherein the optical connector is an LC connector coupled to the at least one optical source via the at least one optical fiber.

3. The optical transceiver apparatus of claim 1, wherein the optical connector is an CS connector coupled to the at least one optical source via the at least one optical fiber.

4. The optical transceiver apparatus of claim 1, wherein the optical connector is an SN connector coupled to the at least one optical source via the at least one optical fiber.

5. The optical transceiver apparatus of claim 1, wherein the optical connector is a mini-duplex connector (MDC) coupled to the at least one optical source via the at least one optical fiber.

6. The optical transceiver apparatus of claim 1, wherein the at least one optical source is a vertical cavity surface emitting laser (VCSEL), an externally modulated laser (EML), an electro-absorption modulator, or a directly modulated laser (DML).

7. The optical transceiver apparatus of claim 1, wherein the electrical connector is an electrical edge connector of the PCB.

8. The optical transceiver apparatus of claim 1, further comprising:
    an integrated circuit attached to the PCB and configured to drive the at least one optical source, wherein a first distance between the integrated circuit and the electrical connector is less than a second distance between the integrated circuit and the at least one optical source.

9. The optical transceiver apparatus of claim 1, wherein the mechanical structure comprises a heatsink portion, and wherein the at least one optical source is attached to the PCB at a location proximate the heatsink portion of the mechanical structure.

10. The optical transceiver apparatus of claim 1, wherein the optical connector is a first optical connector, wherein the first optical connector is coupled to the at least one optical source via a first optical fiber that facilitates transmission of the optical signals, and wherein a second optical connector is attached to the mechanical structure and is coupled to the at least one optical source via a second optical fiber that facilitates transmission of the optical signals.

11. The optical transceiver apparatus of claim 1, wherein the optical source is associated with the first standard, and the optical connector is associated with the second standard that is different from the first standard.

12. The optical transceiver apparatus of claim 11, wherein the first standard is a small form-factor pluggable (SFP) standard, and the second standard is a quad small form-factor pluggable (QSFP) standard.

13. The optical transceiver apparatus of claim 1, wherein the optical source is associated with the first standard, and the mechanical structure of the apparatus that encloses the optical source is associated with the second standard that is different from the first standard.

14. The optical transceiver apparatus of claim 1, wherein the optical source generates optical signals defined by the first standard, and the optical connector interfaces with an optic cable defined by the second standard that is different from the first standard.

15. The optical transceiver apparatus of claim 1, further comprising a network interface module.

16. A method, comprising:
    receiving an electrical signal via an electrical connector associated with a printed circuit board (PCB), wherein the PCB is attached to a mechanical structure of a network interface module;
    controlling, based on the electrical signal, emission of an optical signal via at least one optical source attached to the PCB;
    facilitating communication of the optical signal via an optical connector attached to the mechanical structure of the network interface module, wherein the optical connector is coupled to the at least one optical source via at least one optical fiber,
    wherein the optical connector supports a plurality of N optical lanes defined by a second standard, wherein the at least one optical fiber supports a plurality of K optical lanes defined by a first standard that is different from the second standard, wherein N is a first integer and K is a second integer, and wherein K is less than N.

17. An optical transceiver apparatus comprising:
    at least one optical source associated with a small form-factor pluggable (SFP) standard attached to a printed circuit board (PCB) and configured to facilitate communication of optical signals,
    wherein the PCB comprises an electrical connector associated with a quad small form-factor pluggable (QSFP) standard electrically connected to the at least one optical source and configured to facilitate communication of electrical signals, and wherein the PCB is attached to a mechanical structure; and an optical connector attached to the mechanical structure and coupled to the at least one optical source via at least one optical fiber that facilitates transmission of the optical signals.

18. The optical transceiver apparatus of claim 17, wherein the mechanical structure comprises a heatsink portion, and wherein the at least one optical source is attached to the PCB at a location proximate the heatsink portion of the mechanical structure.

19. The optical transceiver apparatus of claim 17, further comprising:

an integrated circuit attached to the PCB and configured to drive the at least one optical source, wherein a first distance between the integrated circuit and the electrical connector is less than a second distance between the integrated circuit and the at least one optical source.

20. The optical transceiver apparatus of claim 17, further comprising a network interface module.

\* \* \* \* \*